US006316357B1

(12) United States Patent
Lin et al.

(10) Patent No.: US 6,316,357 B1
(45) Date of Patent: *Nov. 13, 2001

(54) METHOD FOR FORMING METAL SILICIDE BY LASER IRRADIATION

(75) Inventors: Kang-Cheng Lin, Taipei; Hong-Woei Wu, Hsinchu, both of (TW)

(73) Assignee: Industrial Technology Research Institute, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/947,381

(22) Filed: Oct. 8, 1997

(51) Int. Cl.$^7$ .................................................. H01L 21/28
(52) U.S. Cl. ......................... 438/662; 438/664; 438/655
(58) Field of Search ...................................... 438/308, 795, 438/663, 664, 660, 661, 662, 655, 682, 683, 151, FOR 155, FOR 352, FOR 360, FOR 418, FOR 419; 148/DIG. 90, DIG. 147

(56) References Cited

U.S. PATENT DOCUMENTS

| | | | |
|---|---|---|---|
| 4,622,735 | * | 11/1986 | Shibata . |
| 5,094,977 | * | 3/1992 | Yu et al. . |
| 5,236,865 | * | 8/1993 | Sandhu et al. . |
| 5,449,642 | * | 9/1995 | Tan et al. . |
| 5,814,537 | * | 9/1998 | Maa et al. ............................. 438/151 |
| 5,879,977 | * | 3/1999 | Zhang et al. ......................... 438/166 |
| 5,888,888 | * | 3/1999 | Talwar et al. ........................ 438/662 |
| 5,937,325 | * | 8/1999 | Ishida ................................... 438/662 |
| 6,156,654 | * | 12/2000 | Ho et al. .............................. 438/664 |

OTHER PUBLICATIONS

Wolf et al., Silicon Processing For The VLSI Era, vol. 1: Process Technology, Lattice Press, 1986, pp. 296–303.*

* cited by examiner

Primary Examiner—Mary Wilczewski
(74) Attorney, Agent, or Firm—Tung & Associates

(57) ABSTRACT

The present invention discloses a method for forming metal silicide on an electronic structure by first depositing a metal layer on top of a silicon layer of polysilicon, single crystal silicon or amorphous silicon capable of forming a metal silicide, and then irradiating the metal layer with laser energy for a sufficient length of time such that a layer of metal silicide is formed at the metal interface with polysilicon, single crystal silicon and amorphous silicon. The unreacted metal layer on the metal silicide is then removed by a wet dipping method by selecting a suitable etchant for the metal. The present invention novel method can be applied to various metallic materials such as Ti, Co, W, Pt, Hf, Ta, Mo, Pd and Cr. The laser source utilized is a pulse Excimer laser of XeCl, ArF or XeF.

20 Claims, 3 Drawing Sheets

LASER ANNEALING

METHOD FOR FORMING METAL SILICIDE BY LASER IRRADIATION

FIELD OF THE INVENTION

The present invention generally relates to a method for forming metal silicide on a silicon surface and more particularly, relates to a method for forming metal silicide on a silicon surface by first depositing a metal layer on top of a silicon surface and then irradiating the metal layer with laser energy for a sufficient length of time such that a layer of metal silicide is formed at the metal/silicon interface.

BACKGROUND OF THE INVENTION

In the fabrication of semiconductor devices, P⁻ and N⁻ type doped regions in single crystal and polycrystalline silicon are formed as active devices. The doped regions form the basic elements of a semiconductor device which must be connected in a specific configuration to form a desired circuit. The circuit must then be accessible to the outside world through conducting pads for testing with metal probes and for bonding into a packaged chip. While doped silicon and polysilicon conduct electricity, they are not useful in forming contacts or interconnects due to their prohibitively large resistance. As a result, at least one low-resistance contact material such as metal must be deposited and patterned to contact the different regions in a chip.

It is known that when contact is made between two dissimilar materials, a contact potential in the form of a barrier typically develops at an interface between the materials. Such a contact formed between a metal and a semiconductor can be categorized as an ohmic contact which ideally is transparent to current and thus allowing a linear current-voltage characteristic with negligible resistance in both directions across the contact. In order to make sub-micron contacts of sufficiently low resistance, surface dopant concentrations of greater than $10^{20}$ cm$^{-3}$ are normally required for achieving a resistance that approaches an ideal ohmic contact so that current may pass with little resistance.

In modern semiconductor devices, specifically those fabricated by the ULSI or the sub-half-micron technology, the depth of the junctions formed in a silicon substrate is reduced when the total dimensions of the device are reduced. One potential problem encountered in reducing the depth of the junctions is the inevitable increase in the sheet and contact resistances of the junctions. A known method for reducing the sheet and contact resistances of junctions, specifically when used in conjunction with a polysilicon contact, is the use of metal silicides for reducing these resistances. Barrier metals are normally deposited on the silicides in order to protect the silicide films and the interfaces with silicon from diffusing species during subsequent processing steps.

Metal silicides can be used in such microelectronic applications by reacting refractory or near noble metals with silicon. Among the more popularly used metal silicides in microelectronics are titanium silicides (TiSi$_2$), cobalt silicide (CoSi$_2$), tungsten silicide (WiS$_2$), platinum silicide (PtSi), molybdenum silicide (MoSi$_2$), palladium silicide (PdSi) tantalum silicide (TaSi$_2$), and chromium silicide (CrSi). When used in conjunction with a polysilicon layer, the silicide films deposited in parallel with the higher-resistivity junction reduces resistance in the transistor regions. The combined metal silicide/polysilicon metallurgy (sometimes called a polycide) presents a major benefit that it can withstand processing temperatures of higher than 550° C., for instance, a reflow temperature of 850° C. during a planarization process for PSG or BPSG. Such high processing temperatures normally cannot be tolerated by other contact materials. Among the different metal suicides, tungsten silicide, titanium silicide and cobalt silicide are the more commonly used materials based on their low resistivity and their stability in contacts with polysilicon gates and junctions.

Enlarged cross-sectional views of the formation of a metal silicide on a polysilicon gate by a conventional method is illustrated in FIGS. 1A~1C. A conventional self-aligned silicidation process for a post-junction-formation silicide performed on a semiconductor device 10 is shown in FIG. 1A. Onto a silicon substrate 12, LOCOS insulators 14 and 16, lightly doped drain regions 18 and 20, a polysilicon gate 22, and gate oxide 24 are first formed by conventional methods. Oxide sidewall spacers 26, 28 for protecting the polysilicon gate 22 are then formed. An ion implantation process is used to form junctions 32, 34 for the source/drain regions. The structure formed in FIG. 1A is representative of a typical self-aligned TiSi$_2$ process.

In the next step of the process wherein metal silicide layer is formed, various techniques such as sputtering, evaporation or chemical vapor deposition can be used to first deposit a metal layer 40 over the polysilicon gate 22 and the exposed single crystal silicon regions. In the present example of TiSi$_2$, a titanium layer 40 is deposited and then annealed by a two-step furnace or rapid thermal annealing process. In the first step, the titanium film is annealed at a temperature of 650° C. in a nitrogen atmosphere such that titanium nitride is formed at the surface of the metal while titanium reacts with silicon and forms TiSi$_2$ in those regions where titanium contacts with silicon. At the annealing temperature of 650° C., a high resistivity TiSi$_2$ forms readily in the exposed silicon regions, while a negligible reaction between titanium and silicon occurs where the metal is in contact with silicon dioxide or silicon nitride insulators. The metal composition in contact with the insulators consists mainly of TiN and unreacted Ti which are then removed by a wet dipping process leaving the metal silicide layer intact. The process results in a self-alignment between the silicide and the exposed silicon regions and therefore, is called a salicide process indicating that silicides formed over polysilicon and single crystal silicon are self aligned to each other. A second annealing step for the TiSi$_2$ is necessary which is typically conducted at a temperature of 800° C. to further transform the silicide to a lower resistivity phase. The metal silicide region 42 over the polysilicon gate 22, and the metal silicide regions 44, 46 formed over the single crystal silicon regions 32, 34 are shown in an enlarged, cross-sectional view in FIG. 1C.

The conventional method for forming metal silicide layers over a polysilicon gate and single crystal silicon source/drain regions shown in FIGS. 1A~1C presents several processing problems. The processing problems occurring in the self-aligned silicide formation process are the formation of a bridge between gate and the source/drain regions, the difficulty in forming silicide on thin layer of polysilicon and shallow diffusion regions, and the thermal stability of thin metal silicides formed. Of these problems, the bridging between a gate and source/drain regions is the most serious. For instance, in the formation of TiSi$_2$, it is known that silicon is the predominant diffusion species that moves through a growing silicide phase to react with the metal. As a result, TiSi$_2$ formation is no longer confined to where Ti contacts Si. For instance, TiSi$_2$ may readily form along the sidewalls of the gate insulators resulting in a short between the gate and the source/drain regions. It has been observed that, under favorable conditions, silicon can diffuse a long distance and thus forming $TiSi_2$ on the sidewall spacers. The extent of the bridge formation is determined by the temperature and the duration of the sintering process occurring between metal and silicon. Since a high temperature of at least 600° C. is normally required to cause a reaction between Ti and Si for the sintering of $TiSi_2$, an extensive diffusion of Si in Ti already occurs at such high temperature. Even though efforts have been made to reduce the bridging problem by utilizing a nitrogen atmosphere and by utilizing a rapid thermal process to reduce the heating time, these efforts have only met limited success and works only up to a temperature of about 680° C.

It is therefore an object of the present invention to provide a method for forming metal silicide on an electronic device that does not have the drawbacks or shortcomings of a conventional silicide formation method.

It is another object of the present invention to provide a method for forming metal silicide on an electronic structure that does not require the use of an extended high temperature exposure such as that conducted in a furnace or in a rapid thermal process.

It is a further object of the present invention to provide a method for forming metal silicide on an electronic structure by irradiating a metal layer deposited on a silicon surface with an energy source for a sufficient length of time.

It is another further object of the present invention to provide a method for forming metal silicide on an electronic structure by first depositing a metal layer on top of a silicon layer and then irradiating the metal layer with laser energy until a layer of metal silicide is formed at the metal/silicon interface.

It is still another object of the present invention to provide a method for forming metal silicide on an electronic structure by first irradiating a metal layer deposited on top of a silicon layer with a laser energy and then removing unreacted metal layer to leave a low resistivity metal silicide layer.

It is yet another object of the present invention to provide a method for forming a metal silicide layer on a thin film transistor structure by first depositing a metal layer of an amorphous silicon layer and then irradiating the metal layer with laser energy until a metal silicide layer is formed at the metal/amorphous silicon interface.

It is still another further object of the present invention to provide a method for forming metal silicide on a silicon substrate by first depositing a metal layer on top of a polysilicon layer and then irradiating the metal layer with laser energy for a sufficient length of time such that a metal silicide layer is formed at the metal/polysilicon interface.

It is yet another further object of the present invention to provide a method for forming metal silicide on a silicon substrate by first depositing a metal layer on top of a single crystal silicon layer and then irradiating the metal layer with laser energy for a sufficient length of time such that a metal suicide layer is formed at the metal/single crystal silicon interface.

SUMMARY OF THE INVENTION

In accordance with the present invention, a method for forming a metal silicide layer on an electronic structure without using furnace or rapid thermal process annealing such that lateral diffusion of silicon in metal and possible formation of a bridge between a polysilicon gate and source/drain regions can be avoided is provided.

In a preferred embodiment, a method for forming a metal silicide layer on a silicon surface is carried out by the operating steps of first providing an electronic structure that has a silicon layer on top, depositing a metal layer capable of forming a metal silicide on top of the silicon layer forming a metal/silicon interface, irradiating the metal layer with laser energy for a sufficient length of time such that a layer of metal silicide is formed at the metal/silicon interface, and removing unreacted metal layer.

In another preferred embodiment, the present invention method for forming a metal silicide layer on a thin film transistor (TFT) structure can be carried out by the steps of first providing a ceramic substrate which has an amorphous silicon layer deposited on top, depositing a metal layer capable of forming a metal silicide on top of the amorphous silicon layer forming a metal/amorphous silicon interface, irradiating the metal layer with laser energy for a sufficient length of time such that a layer of metal silicide is formed at the metal/amorphous silicon interface, and then etching away the unreacted metal layer.

In still another preferred embodiment, a method for forming metal silicide on a silicon substrate that has a layer of polysilicon on top can be carried out by the steps of first providing a silicon substrate that has a polysilicon layer deposited on top, then depositing a metal layer capable of forming a metal silicide on top of the polysilicon layer forming a metal/polysilicon interface, then irradiating the metal layer with laser energy for a sufficient length of time such that a layer of metal silicide is formed at the metal/polysilicon interface, and then removing the unreacted metal layer by a wet dipping method.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming metal silicide on a silicon surface by first depositing a metal layer that is capable of forming a metal silicide on top of a silicon layer forming a metal/silicon interface, then irradiating the metal layer with a laser energy for a sufficient length of time such that a layer of metal silicide is formed at the metal/silicon interface and subsequently, removing the unreacted metal layer by a wet dipping process.

Figure 2A:
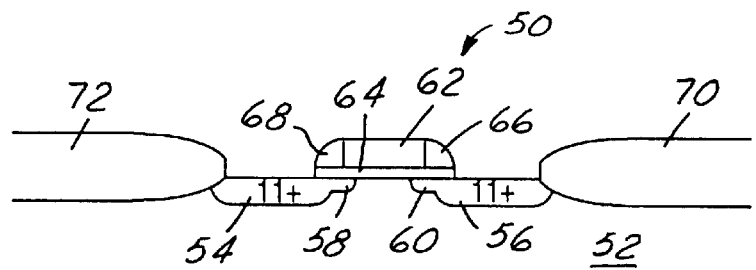
FIG. 2A is an enlarged, cross-sectional view of a present invention semiconductor device having a polysilicon gate and single crystal silicon source/drain regions formed therein.
Figure 2B:
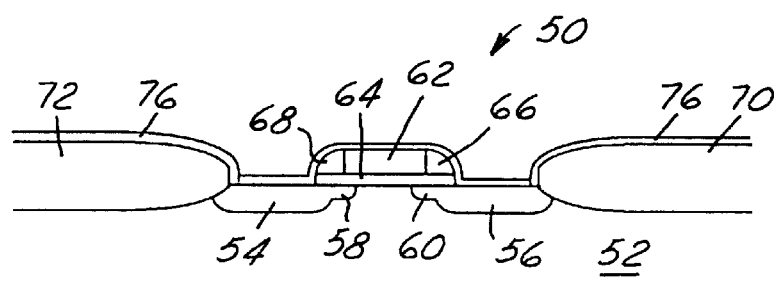
FIG. 2B is an enlarged, cross-sectional view of the present invention semiconductor structure of FIG. 2A having a metal layer deposited on top.

Referring now to FIG. 2A, wherein a present invention semiconductor device 50 is shown. The semiconductor device 50 is formed on a silicon substrate 52 that has N⁻ doped source/drain regions 54, 56 formed on top of lightly doped drain (LDD) regions 58, 60. On top of the silicon substrate 52, a polysilicon gate 62 is formed on a gate oxide insulator 64 and is insulated by sidewall spacers 66, 68. The device 50 is insulated by LOCOS type insulators 70, 72. This is a typical MOSFET device. On top of the MOSFET 50, a metal layer 76 is then deposited to cover the polysilicon gate 62 and the source/drain regions 54, 56 formed of single crystal silicon. It should be noted that, any suitable metallic materials such as those of a refractory metal or a near noble metal of Ti, Co, W, Pt, Hf, Ta, Mo, Cr, and Pd can be used to form metal silicides. A typical forming temperature for these materials lies in between 400° C. and 1100° C. For instance, for $TiSi_2$ the temperature is between 600 and 800° C., for $CoSi_2$ the temperature is between 550 and 700° C., for $WSi_2$ the temperature is between 900 and 1100° C., etc. The sulicide materials that have the lowest resistivities are $TiSi_2$ and $CoSi_2$. The metal can be deposited over the entire wafer 52 by a sputtering method, by an evaporation method, or by a chemical vapor deposition method. Instead of a high temperature annealing process conducted in either a furnace or a rapid thermal process, the present invention novel method of forming metal silicide can be carried out by subjecting the wafer surface to a laser energy. This is shown in FIG. 2C.

Figure 2C:
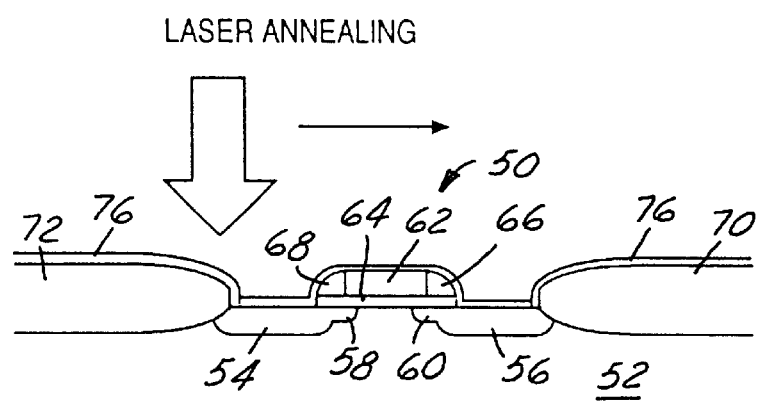
FIG. 2C is an enlarged, cross-sectional view of the present invention semiconductor structure of FIG. 2B having a laser source irradiating on top.

As shown in FIG. 2C, the wafer surface having the metal layer 76 deposited thereon is subjected to a laser energy, i.e., energy generated by a standard Excimer laser such as a XeCl laser, an ArF laser or a XeF laser. The laser is operated at a pulse mode at a frequency of approximately 300 Hz. The XeCl laser can be operated at a wavelength of 308 nm while the XeF laser can be operated at a frequency of 248 nm. A laser scanning technique of 99% overlap is used which indicates that the same wafer surface may be scanned up to 100 times if necessary. It should be noted that, as an added advantage of the present invention novel method, the dosage of laser irradiation and the resulting thickness of the metal silicide layer obtained, can be suitably controlled by the laser irradiation dosage imposed on the semiconductor device. The laser exposure time and frequency (or cycle) can be suitably controlled in order to avoid an overheating of the device surface and thus, effectively minimizing or eliminating the diffusion of silicon toward the metal and the formation of bridging on the oxide sidewall spacers.

The metal layer 76 deposited on top of the device 50 can be suitably controlled at between about 50 Å and about 1000 Å, and preferably between about 100 Å and about 800 Å, and more preferably, between about 300 Å and about 700 Å. A metal silicide layer of less than 50 Å thick is normally formed, even though a range of between about 10 Å and about 100 Å is possible.

Figure 2D:
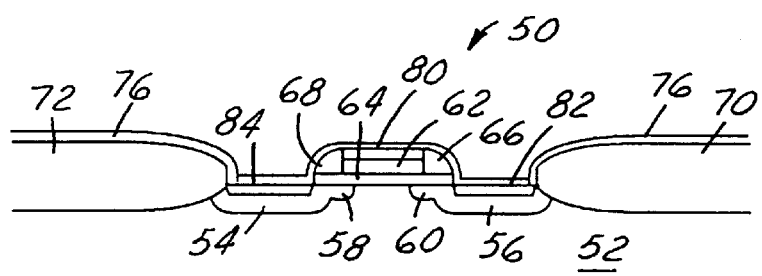
FIG. 2D is an enlarged, cross-sectional view of the present invention semiconductor structure of FIG. 2C after metal silicide layers are formed on the polysilicon gate and on the single crystal source/drain areas.

After the laser annealing process wherein a laser beam scanned over the top of the device 50 for a predetermined number of times, metal silicide layers 80, 82 and 84 are formed over the polysilicon gate 62 and the source/drain regions 56 and 54, respectively. This is shown in FIG. 2D. It should be noted that the thickness of the metal silicide layers 80, 82 and 84 formed can be suitably controlled by the present invention novel method. This is achieved without the danger of overheating the wafer surface and thereby damaging the narrowly spaced insulators in sub-half-micron devices.

Figure 2E:
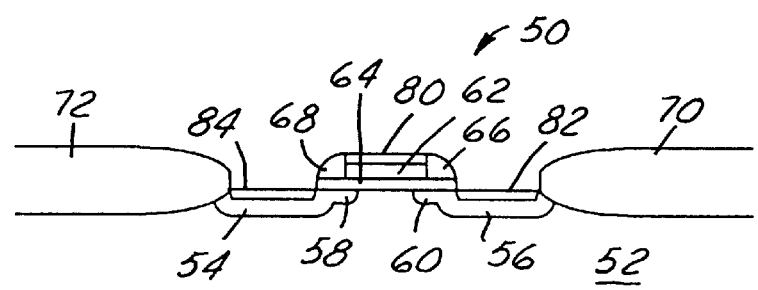
FIG. 2E is an enlarged, cross-sectional view of the present invention semiconductor structure of FIG. 2D after unreacted metal layer is removed in a wet dipping process.

The semiconductor device 50 is then etched in a wet dipping process to remove unreacted metal. This is shown in FIG. 2E. The unreacted metal can be removed by a suitable wet etch chemistry that is specific for the metal. For instance, for a chromium silicide layer, the unreacted chromium can be suitable removed by an etchant mixture of $Ce(NO_3)_2$, $HNO_3$ and $H_2O$. For other metal silicides, suitable etchants should be used, i.e., an etchant solution of $NH_4OH/H_2O_2$ for Ti, an etchant solution of 3 $HCl/H_2O_2$ for Co, and an etchant of $KI/I_2$ for Pd.

It should also be noted that different diffusion mechanisms are believed to have taken place in different metal silicide formation processes. For instance, as previously discussed, silicon is the predominant diffusion species in $TiSi_2$ that moves through a growing suicide to react with Ti. With $CoSi_2$, Co is the species that diffuses through the film toward the silicon-silicide interface. With platinum and palladium, metal-rich or mono-silicides are formed at temperatures near 600° C. and metal, rather than silicon, diffuses through the growing silicides. In all cases, silicon is consumed and the silicide penetrates into the regions both vertically and laterally.

The present invention novel method of forming metal silicide on a silicon surface, of either polysilicon or single crystal silicon, is therefore amply demonstrated by the above descriptions and the appended drawings of FIGS. 2A~2E.

Figure 3A:
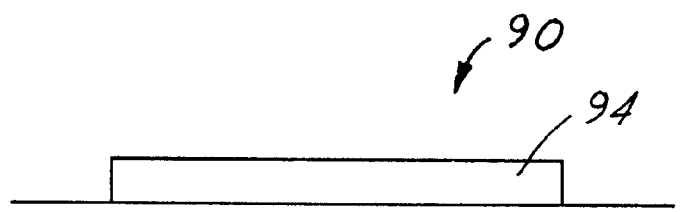
FIG. 3A is an enlarged, cross-sectional view of a present invention thin film transistor (TFT) device having an amorphous silicon layer deposited on top of a glass substrate.
Figure 3B:
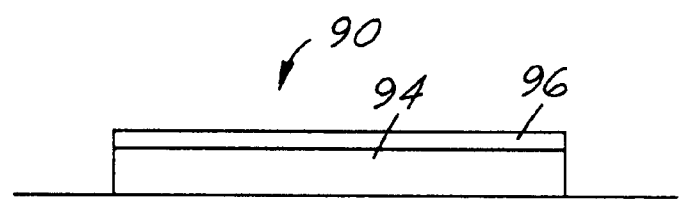
FIG. 3B is an enlarged, cross-sectional view of the present invention TFT device of FIG. 3A having a metal layer deposited on top of the amorphous silicon layer.

In another possible application of the present invention novel method, the method can be used advantageously in the formation of a metal silicide on a thin film transistor (TFT) device. This is shown in FIGS. 3A~3E. In a TFT device, an insulating substrate such as that made of a ceramic material of glass or quartz is used as the base substrate. This is shown as substrate 92 in device 90 in FIG. 3A. Onto substrate 92, an amorphous silicon layer 94 is first deposited and then formed. A metal layer 96 is then deposited over the amorphous silicon layer 94, as shown in FIG. 3B. The metal can be suitably selected from Ti, Co, W, Pt, Hf, Ta, Mo, Pd and Cr. The deposition method used can be similar to that previously described in the silicon wafer process illustrated in FIG. 2B. The thickness of the metal layer 96 can be suitably selected between about 50 Å and about 1000 Å, preferably between about 100 Å and about 900 Å, and more preferably between about 300 Å and about 700Å.

Figure 3C:
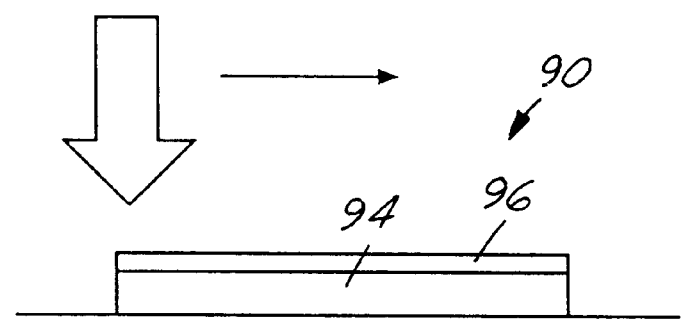
FIG. 3C is an enlarged, cross-sectional view of the present invention TFT device of FIG. 3B having a laser energy irradiating on top.
Figure 3D:
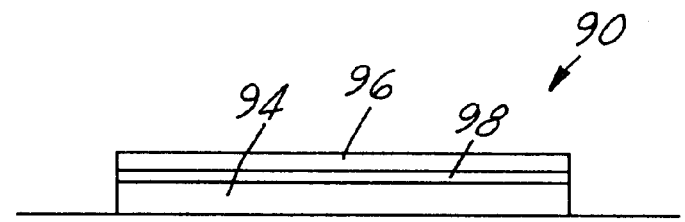
FIG. 3D is an enlarged, cross-sectional view of the present invention TFT device of FIG. 3C having a metal silicide layer formed at the metal/amorphous silicon interface.
Figure 3E:
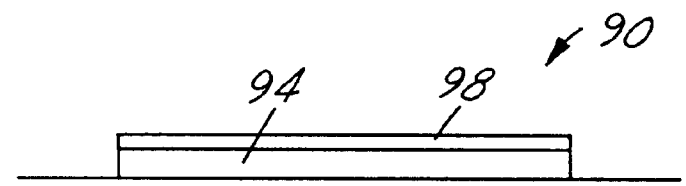
FIG. 3E is an enlarged, cross-sectional view of the present invention TFT device of FIG. 3D having unreacted metal layer removed in a wet dipping process.

The metal layer 96 deposited on top of the TFT device 90 is then exposed to a laser energy source, as shown in FIG. 3C. The laser energy source utilized may be similar to that used in the silicon wafer process shown in FIG. 2C. The dosage or the number of scans of the pulsed laser can be suitably controlled depending on the thickness of the metal silicide layer desired. After repeated scanning by the laser, a metal silicide layer 98 is formed at the interface between the metal layer 96 and the amorphous silicon layer 94. A suitable power level of the laser used is between about 300 and about 400 m Joule. The thickness of the metal silicide layer 98 formed is normally less than 50 Å.

After the formation of the metal silicide layer 98, the TFT device 90 is etched in a wet dipping process by a suitable etchant such that the unreacted metal layer 96 can be removed. Depending on the nature of the metal layer 96, different etchant should be used to thoroughly remove the unreacted metal layer. A suitable etchant for removing chromium on top of a chromium silicide layer can be an aqueous solution of Ce $(NO_3)_2$ and $HNO_3$. Other suitable etchants should be selected for other types of metallic materials.

Figure 1A:
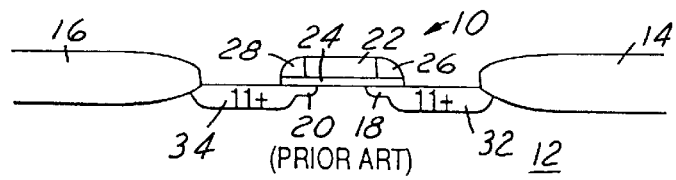
FIG. 1A is an enlarged, cross-sectional view of a conventional semiconductor structure having a polysilicon gate and single crystal silicon source/drain regions formed therein.
Figure 1B:
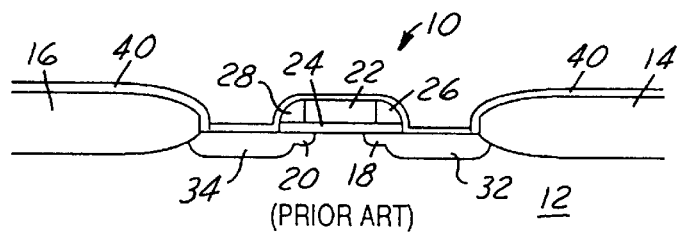
FIG. 1B is an enlarged, cross-sectional view of the conventional semiconductor structure of FIG. 1A having a metal layer deposited on top of the polysilicon gate and the single crystal silicon regions.
Figure 1C:
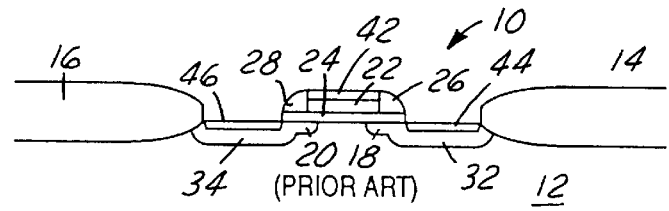
FIG. 1C is an enlarged, cross-sectional view of the conventional semiconductor structure of FIG. 1B after a furnace annealing process wherein metal silicide layers are formed over the polysilicon gate and the single crystal silicon source/drain regions.
Figure 4:
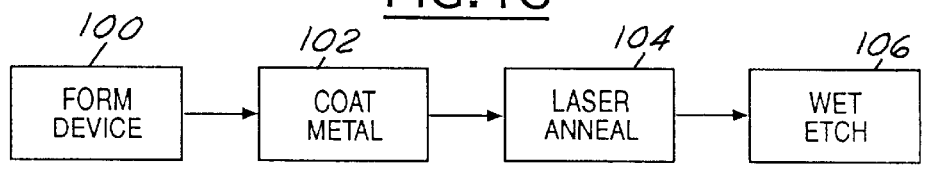
FIG. 4 is a flow chart illustrating the present invention method for forming metal silicide layers by the laser irradiation process.

FIG. 4 illustrates a process flow chart for the present invention novel method of utilizing laser irradiation for forming, metal silicide layers on an electronic structure. The novel method can be started by step 100 wherein an electronic device is pre-processed and formed. The pre-processed electronic device is then coated with a suitable metallic material that is capable of forming a metal silicide layer with either polysilicon, amorphous silicon or single crystal silicon. This is shown as step 102. In the next step 104 of the process, the metal layer coated electronic structure is exposed to a laser irradiation at a predetermined dosage by suitably selecting the scanning rate and the scanning cycles. After the formation of a metal silicide layer at the interface between metal and silicon, shown in step 106, the electronic structure is etched in a wet dipping process utilizing a suitable etchant to remove the unreacted metal layer from the structure.

The effectiveness of the present invention novel method is proven by utilizing data generated on a TFT device onto which a chromium silicide layer is formed. The existence of the chromium silicide layer is proven by a drastic reduction in its sheet resistance. For instance, the sheet resistance in an amorphous silicon is in the range of approximately $10^{12}$ ohm/square. After the formation of a chromium silicide layer on top, the sheet resistance dropped to approximately $10^3$ ohm/square. A second evidence that the present invention novel method is effective in forming chromium silicide layer is obtained in an ESCA test by measuring the bond energy. Finally, an X-ray diffraction pattern was used to prove the existence of the chromium silicide layer. Table 1 illustrates data obtained on a chromium silicide layer by measuring the diffraction pattern for such layer.

TABLE 1

| R, Diffraction Pattern Measured | d, Standard Data from JCPOS-ICDD Card |
|---|---|
| 1.276 | 1.3393 |
| 1.414 | 1,4801 |
| 1.517 | 1.54498 |
| 1.62 | 1.5694 |
| 1.793 | 1.7137 |
| 1.966 | 2.0436 |
| 2.173 | 2.1396 |
| 2.38 | 2.3197 |

The calculation for the diffraction data can be illustrated as follow:

$$2d\sin\theta = m\lambda$$

$$\tan 2\theta = \frac{R}{L}$$

$$\theta = \frac{m\lambda}{2d}$$

$$R = L\tan 2\theta$$

$$= L2\theta = L\frac{\lambda}{d}$$

$$= 80 \text{ um} \times \frac{0.0251}{1.414}$$

$$R = 1.42 \text{ um}$$

since $Rd = \lambda L$ $R1 : R2 : R3 \ldots$ (measured from diffraction pattern)

should be proportional to $$\frac{1}{d_1} : \frac{1}{d_2} : \frac{1}{d_3} \ldots \text{ (from Table)}$$

$$R_1 : R_2 : R_3 \ldots = 1 : 1.172 : 1.276 : 1.414 : 1.517 : 1.62 : 1.793 : 1.926 : 2.172 : 2.38$$

-continued $$\frac{1}{d_1}:\frac{1}{d_2}:\frac{1}{d_3}\ldots = \frac{1}{3.28}:\frac{1}{2.449}:\frac{1}{2.216}:\frac{1}{2.123}:\frac{1}{2.090}:\frac{1}{1.914}:\frac{1}{1.817}:\frac{1}{1.605}:\frac{1}{1.533}:$$

$$\frac{1}{1.414}:\frac{1}{1.292} = 1:1.393:1.4801:1.54498:1.5694:1.7137:1.80517:2.0436:2.1396:$$

$$2.3197:2.5387$$

Figure 5:
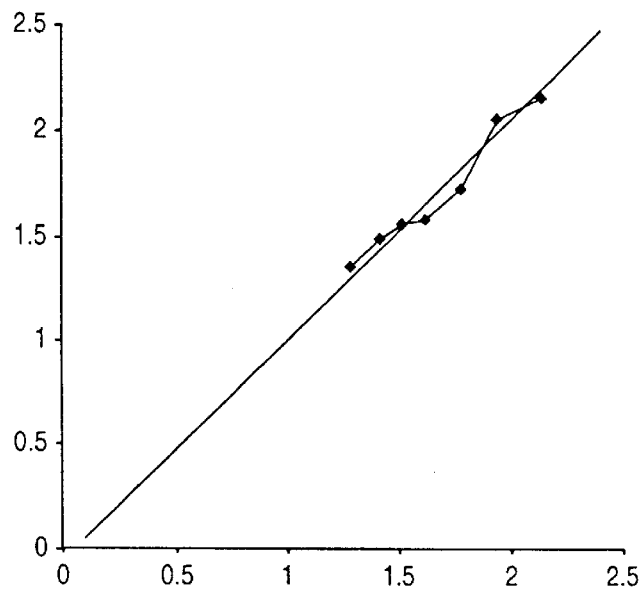
FIG. 5 is a graph illustrating evidence for the formation of chromium suicide by the present invention method by comparing test data to standard crystallography data.

This data are then plotted in FIG. 5 which illustrates the diffraction pattern data measured on the chromium silicide layer obtained by the present invention novel method compared to the standard crystallography data shown by the straight diagonal line. It is seen that the data from on the chromium silicide layer formed by the present invention method overlaps the standard crystallography data and therefore proven the chemical make-up of the layer.

The present invention novel method has therefore been amply demonstrated by a silicon wafer example wherein metal silicide is formed on top of polysilicon and single crystal silicon, and a thin film transistor example wherein metal silicide is formed over a layer of amorphous silicon by the above descriptions, the appended drawings and the table.

While the present invention has been described in an illustrative manner, it should be understood that the terminology used is intended to be in a nature of words of description rather than of limitation.

Furthermore, while the present invention has been described in terms of the preferred embodiments, it is to be appreciated that those skilled in the art will readily apply these teachings to other possible variations of the invention.

The embodiment of the invention in which an exclusive property or privilege is claimed are defined in the following claims.

What is claimed is:

1. A method for forming metal silicide on an amorphous silicon surface comprising the steps of:
   providing an electronic structure having a silicon layer on top, said silicon layer being formed of an amorphous silicon,
   depositing a metal layer capable of forming a metal silicide on top of the silicon layer forming a metal/silicon interface,
   irradiating the metal layer with laser energy for a sufficient length of time such that a layer of metal silicide of less than 50 Å thick is formed at the metal/silicon interface, and
   removing the unreacted metal layer.

2. A method according to claim 1, wherein said electronic structure is a ceramic substrate having an amorphous silicon layer deposited on top.

3. A method according to claim 1, wherein said electronic structure is a silicon substrate having a layer of polysilicon deposited on top.

4. A method according to claim 1, wherein said metal layer is deposited of a material selected from the group consisting of Co, Cr, Ta, Ti, W, Pd, Hf and Mo.

5. A method according to claim 1, wherein said metal layer is deposited to a thickness of between about 50 Å and about 1,000 Å.

6. A method according to claim 1, wherein said metal layer is preferably deposited to a thickness of between about 300 Å and about 700 Å.

7. A method according to claim 1 wherein said metal layer is more preferably deposited to a thickness of between about 450 Å and about 550 Å.

8. A method according to claim 1, wherein said pre-processed electronic structure is a self-aligned MOSFET device.

9. A method according to claim 1, wherein said metal silicide formed has a thickness between about 10 Å and about 100 Å.

10. A method according to claim 1, wherein said laser energy is supplied from a Excimer laser operated in a pulse mode.

11. A method according to claim 10, wherein said Excimer laser is selected from the group consisting of a XeCl laser, a ArF laser and a XeF laser.

12. A method according to claim 10, wherein said Excimer laser operates in a wavelength range between about 220 nm and about 320 nm.

13. A method according to claim 1, wherein said sufficient length of time for laser irradiation is between about 5 ns and about 200 ns.

14. A method according to claim 1, wherein said sufficient length of time for laser irradiation is preferably between about 30 ns and about 100 ns.

15. A method according to claim 1, wherein said unreacted metal layer is removed by a wet dipping method.

16. A method according to claim 15, wherein said wet dipping method utilizes an aqueous solution of $Ce(No_3)_2$ and $HNO_3$.

17. A method for forming a metal suicide layer on a thin film transistor (TFT) structure comprising the steps of:
   providing a ceramic substrate having an amorphous silicon layer deposited on top,
   depositing a metal layer capable of forming a metal silicide on top of the amorphous silicon layer forming a metal/amorphous silicon interface,
   irradiating the metal layer with laser energy in a pulse mode for a multiple number of times sufficient to form a layer of metal silicide at the metal/amorphous silicon interface, and
   etching away the unreacted metal layer.

18. A method according to claim 17, wherein said metal layer is deposited of a material selected from the group consisting of Co, Cr, Ta, Ti, W, Pd, Hf and Mo, and to a thickness between about 50Å and about 1000 Å.

19. A method according to claim 17, wherein the laser energy is supplied by an Excimer laser of a XeCl laser, an ArF laser or a XeF laser.

20. A method according to claim 17, wherein a cooling period is provided between said multiple number of times the metal layer is exposed to the laser energy such that overheating of the substrate is avoided.

* * * * *